United States Patent [19]

Star et al.

[11] Patent Number: 4,507,740

[45] Date of Patent: Mar. 26, 1985

[54] PROGRAMMABLE SIGNAL ANALYZER

[75] Inventors: Albert A. Star, Dix Hills; John M. Weick, Centerport, both of N.Y.

[73] Assignee: Grumman Aerospace Corporation, Bethpage, N.Y.

[21] Appl. No.: 300,254

[22] Filed: Sep. 8, 1981

[51] Int. Cl.³ .............................................. G06F 15/31
[52] U.S. Cl. ................................. 364/487; 324/77 R
[58] Field of Search ........................ 324/77 R, 121 R; 364/481, 482, 483, 487, 579, 580, 582; 340/715

[56] References Cited

U.S. PATENT DOCUMENTS

| | | | |
|---|---|---|---|
| 3,066,257 | 4/1953 | Fischer | 324/121 R |
| 3,504,164 | 4/1964 | Farrell et al. | 364/487 |
| 3,539,726 | 12/1968 | Bolie | 381/45 |
| 3,548,305 | 1/1967 | Kaufman | 324/77 R |
| 3,566,095 | 2/1971 | Schmitz | 364/752 |
| 3,621,388 | 11/1971 | Davis | 324/77 |
| 3,758,763 | 9/1973 | Nohara et al. | 235/151.31 |
| 3,790,767 | 2/1974 | Alexander | 235/151.31 |
| 3,812,334 | 5/1974 | Gollomp | 364/481 |
| 3,872,461 | 3/1975 | Jarosik et al. | 340/324 AD |
| 3,927,309 | 12/1975 | Fuiwara et al. | 235/151.31 |
| 4,041,386 | 8/1977 | Thomas et al. | 324/77 R |
| 4,047,007 | 9/1977 | Dlugos et al. | 235/151.33 |
| 4,064,488 | 12/1977 | Chapman | 340/171 R |
| 4,065,664 | 12/1977 | Kristof et al. | 364/487 |
| 4,072,851 | 2/1978 | Rose | 364/487 |
| 4,086,651 | 4/1978 | Muir et al. | 364/487 |
| 4,091,379 | 5/1978 | Wu et al. | 364/347 |
| 4,104,725 | 8/1978 | Rose et al. | 364/487 |
| 4,200,933 | 4/1980 | Nickel et al. | 364/571 |
| 4,397,021 | 8/1983 | Lloyd et al. | 364/580 X |
| 4,402,055 | 8/1983 | Lloyd et al. | 364/580 X |

OTHER PUBLICATIONS

Miki et al., "An Accurate Wide-Band Automatic Waveform Analyzer", IEEE Transactions on Instrumentation and Measurement, vol. IM-26, No. 4, Dec. 1977, pp. 279-291.

Primary Examiner—Edward J. Wise
Assistant Examiner—Edward R. Cosimano
Attorney, Agent, or Firm—Morgan, Finnegan, Pine, Foley & Lee

[57] ABSTRACT

A programmable multi-channel signal analyzer capable of automatically evaluating and displaying various parameters of complex analog waveforms is disclosed. A non-real time sampling technique which makes use of the repetitive nature of the input analog signal is utilized to achieve the desired high frequency digitizing of the analog signal. Subsequent data reduction, parameter evaluation and display of test results are achieved under the control of a microprocessor-controlled subsystem. Communication with an external host system is effected by means of the IEEE-488 general purpose interface bus.

8 Claims, 7 Drawing Figures

PROGRAMMABLE SIGNAL ANALYZER

BACKGROUND OF THE INVENTION

This invention relates to the field of high performance signal analyzers, and more particularly to a programmable signal analyzer which permits automatic evaluation of various parameters of complex analog waveforms.

The use of automatic test equipment (ATE) for the testing of digital systems has already been firmly established, and its application to the testing of analog signals is rapidly expanding. However, the testing of analog signals has been somewhat complicated by the difficulties inherent in the interpretation of analog signals which theoretically have an unlimited number of amplitude versus time characteristics. Many of the currently available signal analyzers, although capable of evaluating various characteristics of complex analog waveforms, rely heavily on operator involvement in the analysis process, i.e., the operator must usually examine an oscilloscope-type display and adjust manual controls to position markers and vary brightness to effect the "automatic" analysis. It is quite clear that this operator involvement can create error in the interpretation and/or execution of the "automatic" analysis process An optimal signal analyzer for evaluating the basic parameters, such as, for example, frequency, pulse width, rise time, fall time, base line, amplitude, etc., of complex analog waveforms would have several basic capabilities. First, the signal analyzer should be capable of automatically evaluating the basic parameters for complex analog waveforms, such as, for example, ramps, pulse trains, pulses on pedestals, etc. It should be able to eliminate the spurious elements, such as, for example, overshoot, preshoot, and noise, that tend to complicate the measurement process and obscure the interpretation of the basic analog parameters being evaluated.

Second, the signal analyzer should be compatible with the software. It should work in a high level language environment such as, for example, ATLAS, operate off the IEEE-488 general purpose interface bus and be easy to program.

Third, the signal analyzer should be self-contained, i.e., it should have all of the computational and decision making capability necessary to provide and display meaningful test parameter outputs for the measured analog signal. And finally, it should be reliable, maintainable, and cost-effective, i.e., it should be simple with as few parts as possible.

It is believed that prior to the present invention, there has not been available a programmable signal analyzer capable of automatically evaluating the basic parameters of complex analog waveforms.

It is accordingly a general object of the present invention to provide a programmable analog signal analyzer which has characteristics more nearly approaching the optimal attributes described above, particularly those applicable to ATE applications.

It is a particular object ot the invention to provide a programmable signal analyzer capable of automatically evaluating the basic parameters of complex analog waveforms.

Other objects will be apparent in the following detailed description and the practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as a programmable analog signal analyzer comprising: autoranging means for normalizing the amplitude of the analog input signal; conversion means and associated delays means converting the normalized analog signal into digital data, said conversion means including means for storing the digital data; microprocessor means and associated reference timing means for controlling the operation of said autoranging means, said delay means and said conversion means, said microprocessor means including means for calculating from the stored digital data values of selected parameters of the analog input signal; and means for displaying the calculated values of the selected parameters of the input analog signal.

BRIEF DESCRIPTION OF THE DRAWINGS

Serving to illustrate an exemplary embodiment of the invention are the drawings of which.

DETAILED DESCRIPTION OF PREFERRED EMBODIMENT

Figure 1:
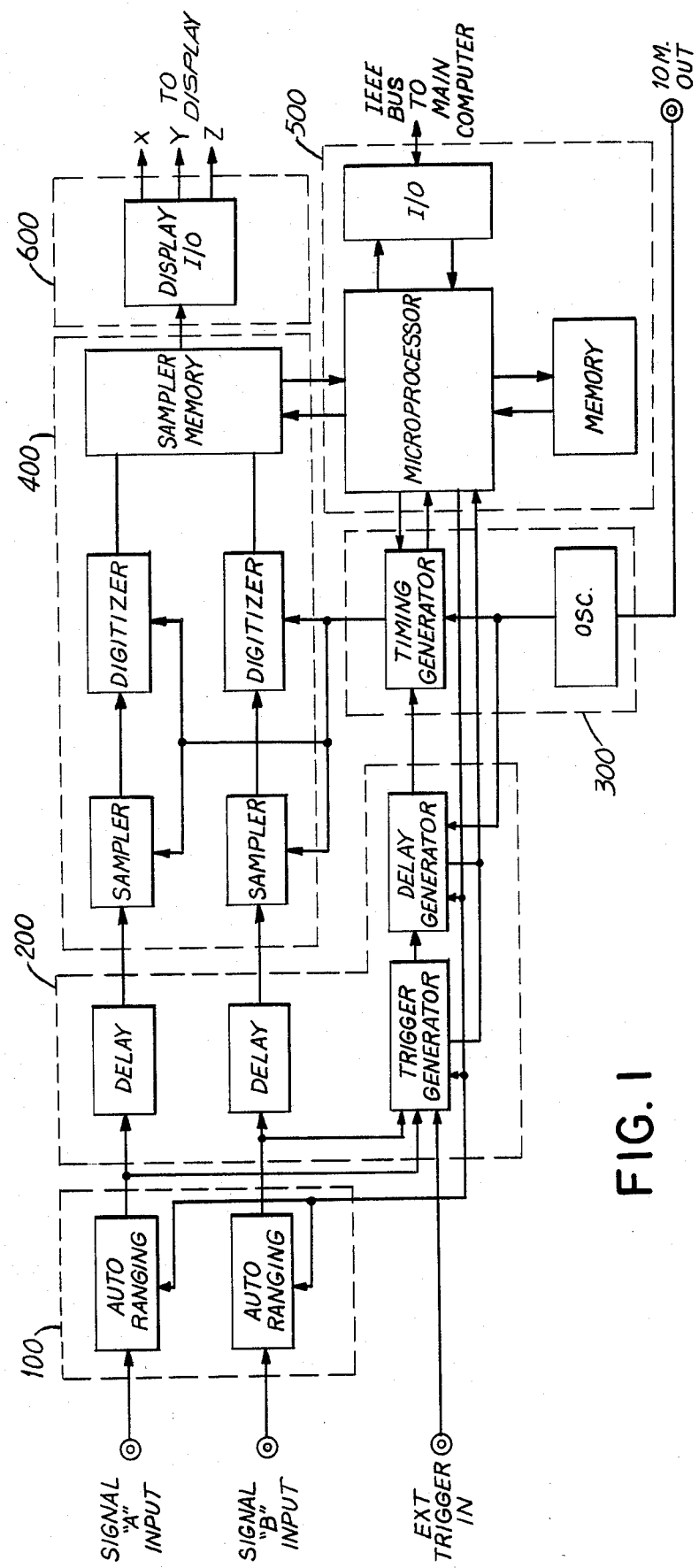
FIG. 1 is a functional block diagram of the programmable signal analyzer, in accordance with the present invention.

Referring to FIG. 1, a block diagram of a preferred embodiment of the programmable analog signal analyzer, in accordance with the present invention, is illustrated. As shown therein, the signal analyzer consists of two independent signal channels. It is noted, however, that a minimum configuration signal analyzer would contain a single signal channel. Likewise, by utilizing the teachings discussed below, the number of signal channels may be increased to whatever number is necessary to accommodate the user's needs and requirements.

The programmable signal analyzer illustrated in FIG. 1 may be broken down into several functional subsystems including an autoranging subsystem 100, a time delay and triggering subsystem 200, a reference timing subsystem 300, a sampling and memory subsystem 400, a microprocessor and interface subsystem 500; and a display subsystem 600. Functionally, the autoranging subsystem acquires and processes the input analog data; the sampling and memory subsystem and the time delay and triggering subsystem convert and store the input analog data to digital format; the microprocessor and interface subsystem and the reference timing subsystem control the operation of the analyzer and calculate values of selected parameters of the analog input signal; and the display subsystem visually presents the calculated values to the user.

As configured, and explained in more detail below, the programmable signal analyzer is a stand alone microprocessor-controlled test instrument. It is capable of calculating the values of various analog waveform parameters and providing them to a host system (not shown) upon demand. It is also capable of providing a digital representation (approximately 2000 eight-bit words) of an incoming analog waveform upon demand. All functions are remotely programmable via the IEEE-488 general purpose interface bus.

A non-real time sampling technique is utilized to achieve the desired frequency digitizing of the analog input signal. This technique makes use of the repetitive nature of the analog signal to take many narrow aperture samples of the waveshape. Although only one sample of the waveshape is taken at any given instant of time, each subsequent sample is indexed later in time, from a trigger reference point, until the desired number of samples are obtained. All of the analog samples are converted to corresponding digital words and stored in a memory for parameter evaluation by the microprocessor.

Figure 2:
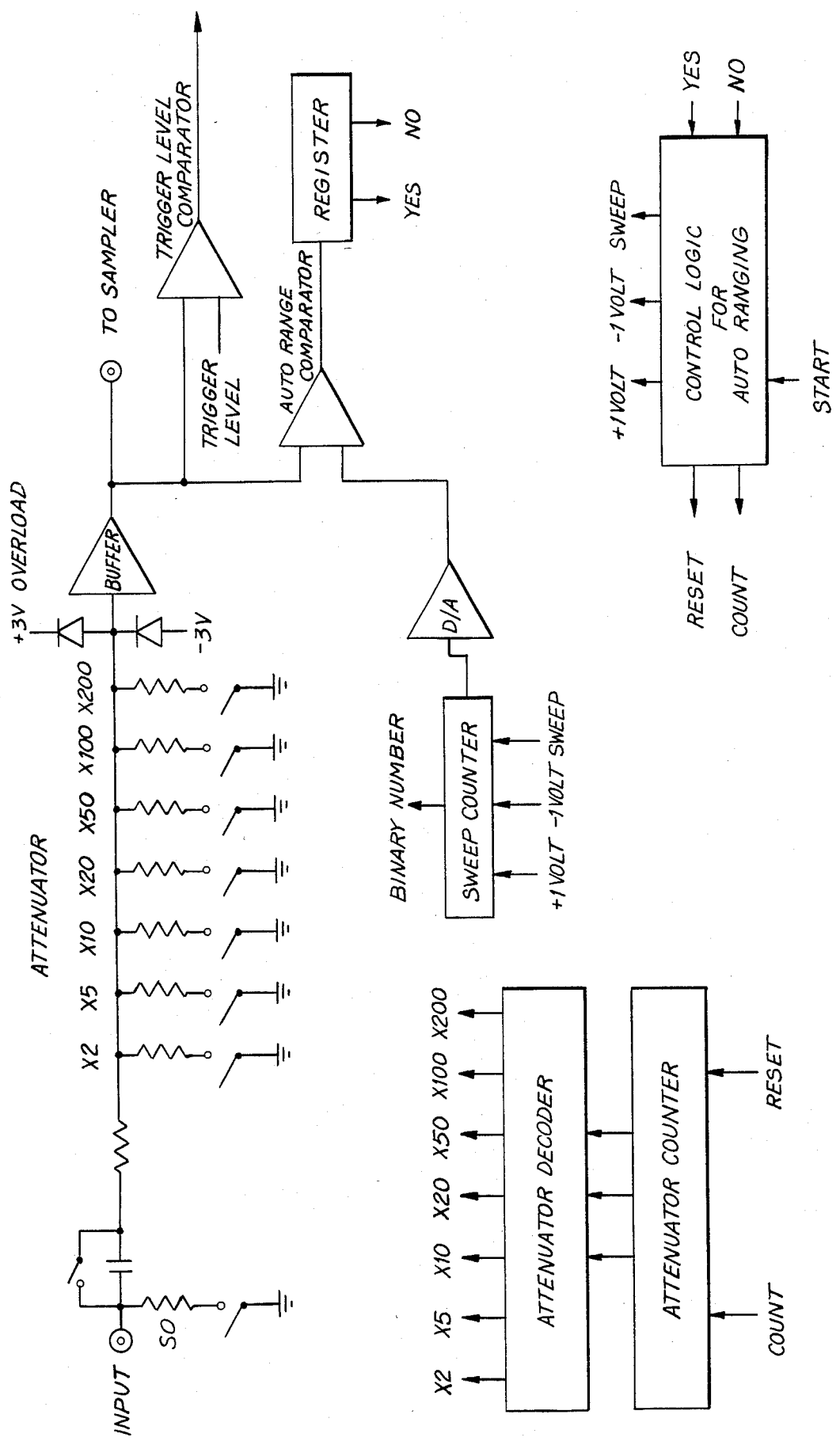
FIG. 2 is a block diagram of the autoranging subsystem.

A block diagram of the autoranging subsystem is illustrated in FIG. 2. The autoranging subsystem is used to normalize the amplitude of input analog waveform within a +or − 1 volt window for subsequent data reduction and processing in the signal analyzer. The circuitry includes provisions for impedance matching, AC coupling, programmable attenuation (X1, X2, X5, X10, X20, X50, X100, X200), overload protection, comparison of known and unknown voltage levels, and voltage sweep generation.

Upon receipt of the autoranging instruction from the microprocessor, the input attenuator counter is reset (providing zero attenuation), the input analog waveform is applied to one input of the autoranging comparator (it may be clipped or clamped, or both at ±3 V by the overload circuitry which is used to protect the input buffer) and a +1 volt reference is applied to the other comparator input. The analog input signal is compared with the +1 volt reference, and if it is greater than +1 volt, the comparator output is placed in a register which allows the attenuator to increase by one count, which in turn is decoded, and pulls in the X2 relay. The same steps are repeated, stepping the attenuation until the amplitude of the analog input signal is less than +1 volt at the input to the comparator. Once the input amplitude is less than +1 volt, the reference voltage applied to the comparator is switched to −1 volt and the analog input signal is examined to see if it is more negative than −1 volt. If so, the attenuator counter is allowed to step by one count to provide more attenuation. The process is continued until the amplitude of the input analog signal has been attenuated to a level between + and −1 volt. Thereafter, the + and −1 volt window is stepped in 10 millivolt increments and compared to determine the most negative and most positive portions of the input waveform. These values are stored. Similarly, the 10%, 50% and 90% levels are calculated and stored for subsequent processing, such as, for example, rise time measurements.

Figure 3:
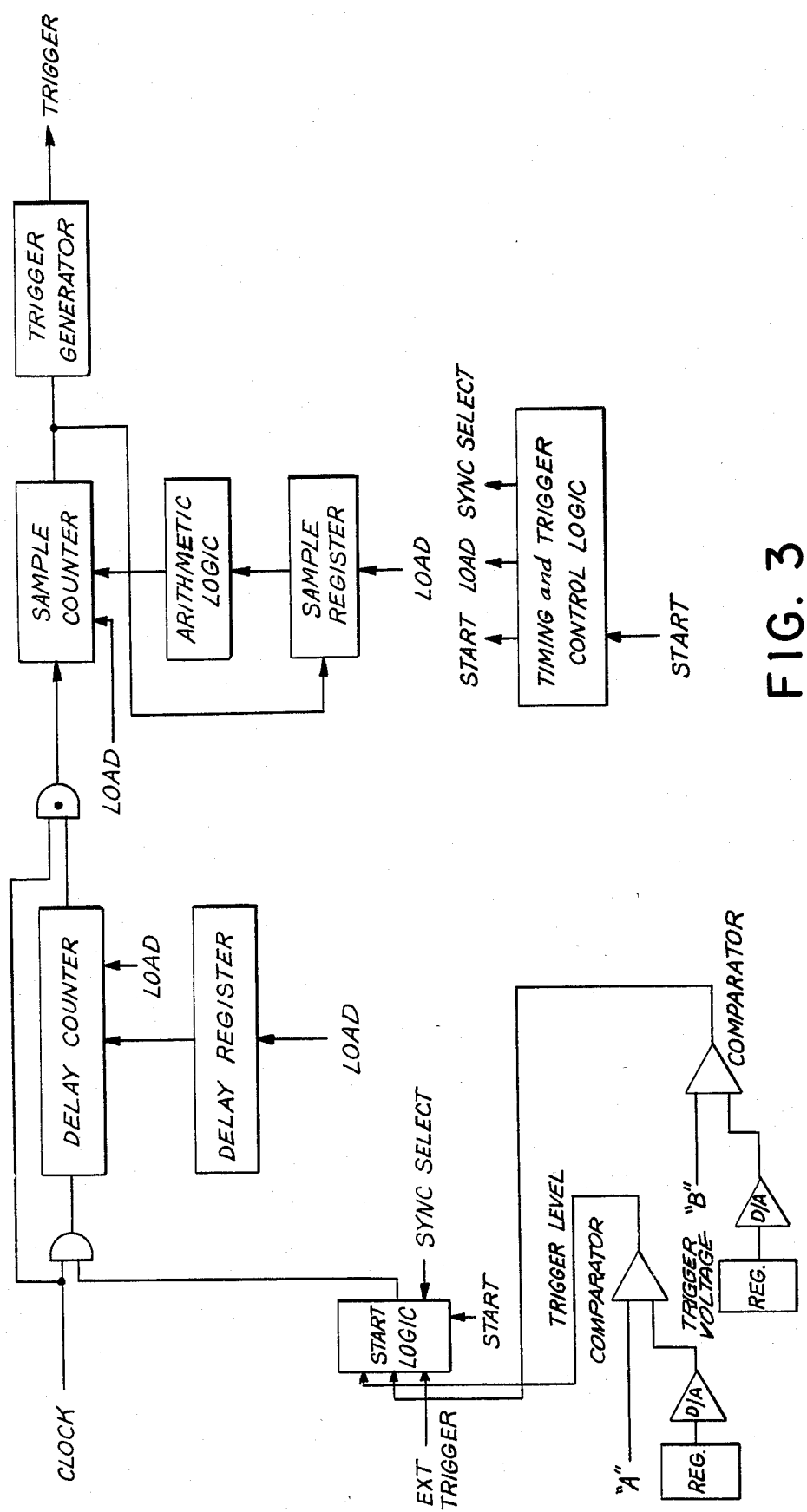
FIG. 3 is a block diagram of the time delay and triggering subsystem.

A block diagram of the time delay and triggering subsystem is illustrated in FIG. 3. The time delay and triggering subsystem is used to provide all the timing signals required to sample the input analog waveform. It is capable of operating in response to either an internal or external trigger input. The circuitry consists of counters, registers, pulse forming network, D/A converters, and comparators. The "A" input to the trigger level comparator of FIG. 3 is shown in the schematic of FIG. 2 when it is labeled trigger level. The "B" input to the second trigger level comparator originates in a second channel which has not been illustrated in FIG. 2 for the purposes of simplicity.

As configured, a trigger is provided to the sampler a specific period of time (predetermined by the microprocessor) after the occurrence of a synchronizing signal. The synchronizing signal can be an external signal related to the analog input waveform or it can be internally generated by the trigger level comparator.

The time delay between the sychronizing signal and the trigger is determined by allowing a sample counter to count an accurate known frequency, i.e., the number of cycles multiplied by the number of counts within the counter equals the delay time between the trigger and the synchronizing signal. As configured, the sample counter is programmable between 0 counts and 1999 counts. If the sample counter is programmed to 1999 counts, the delay trigger will appear immediately after the synchronizing trigger, and if it is programmed to 0 counts, the delay trigger will appear 1999 times the input clock period (1/FREQ) after the synchronizing trigger.

In order to provide an orderly delay, increasing by one each time, the sample counter is loaded with 1999, 1998, 1997, ... 0. This load is automatic, i.e., it is provided by a sample register which keeps track of the number of samples done. This number of samples is subtracted from 1999 and the difference is loaded into the sample counter. The sample register starts at 0, thus, 1999−0=1999 which is loaded in the sample counter, then 1999−1=1998 is loaded and so on until 1999−1999=0 is loaded. This circuitry allows the trigger to step along at known period rate (of clock) with respect to the synchronizing trigger.

A delay counter provides for a known delay prior to the generation of the sample trigger, effectively creating a sliding window to position the sample trigger. As configured, the delay counter has a capacity of 64,000 counts. The sample triggers are generated by a monostable multivibrator and are one micro-second wide.

The sample counter and register are reconfigured to function as an 8½ digit accumulator, in order to make frequency or time interval measurements.

Figure 4:
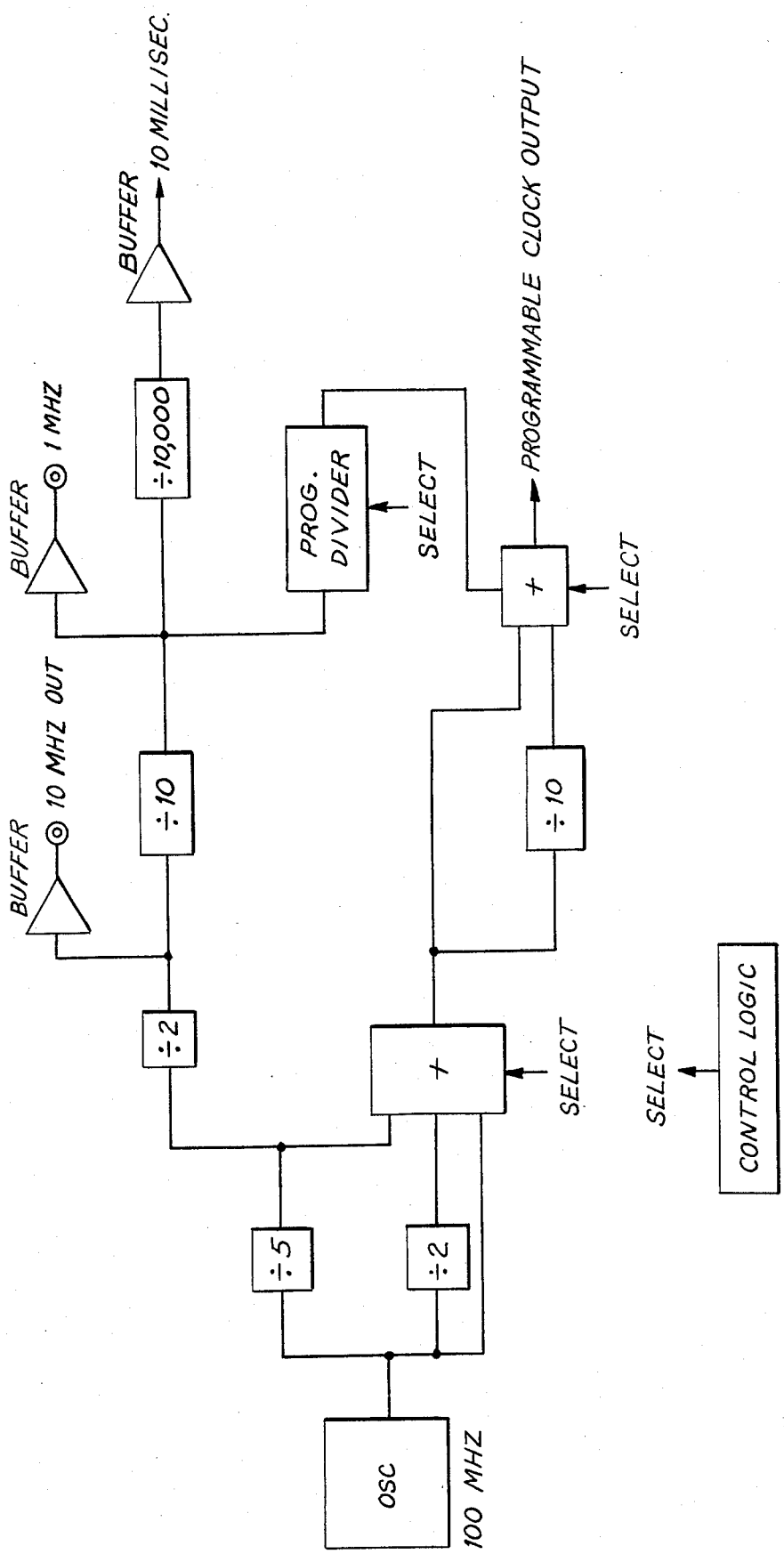
FIG. 4 is a block diagram of the reference timing subsystem.

A block diagram of the reference timing subsystem is illustrated in FIG. 4. As shown therein, all the reference timing is derived from a 100 MHZ quartz crystal oscillator. The 100 MHZ frequency is divided down using high speed logic to various frequencies by fixed and programmable dividers. Fixed output frequencies of 10 MHZ, 1 MHZ and 0.01 HZ are derived from fixed dividers, by, first dividing 100 MHZ by 10 (÷5 & ÷2) to 10 MHZ, then by 10 again to 1 MHZ, and then by 10,000 to 0.01 HZ.

The programmable clock output provides periods (1/FREQ), ranging from 10 nanoseconds to 10 seconds by an appropriate combination of dividers. The possible clock periods available are: 10 nanoseconds, 20 nanoseconds, 50 nanoseconds, 100 nanoseconds, 200 nanoseconds, 500 nanoseconds, 1 microsecond, 10 microseconds, 100 microseconds, 1 millisecond, 10 milliseconds, 100 milliseconds, 1 second and 10 seconds. The programmable clock is used as the reference timing throughout the system.

Figure 5:
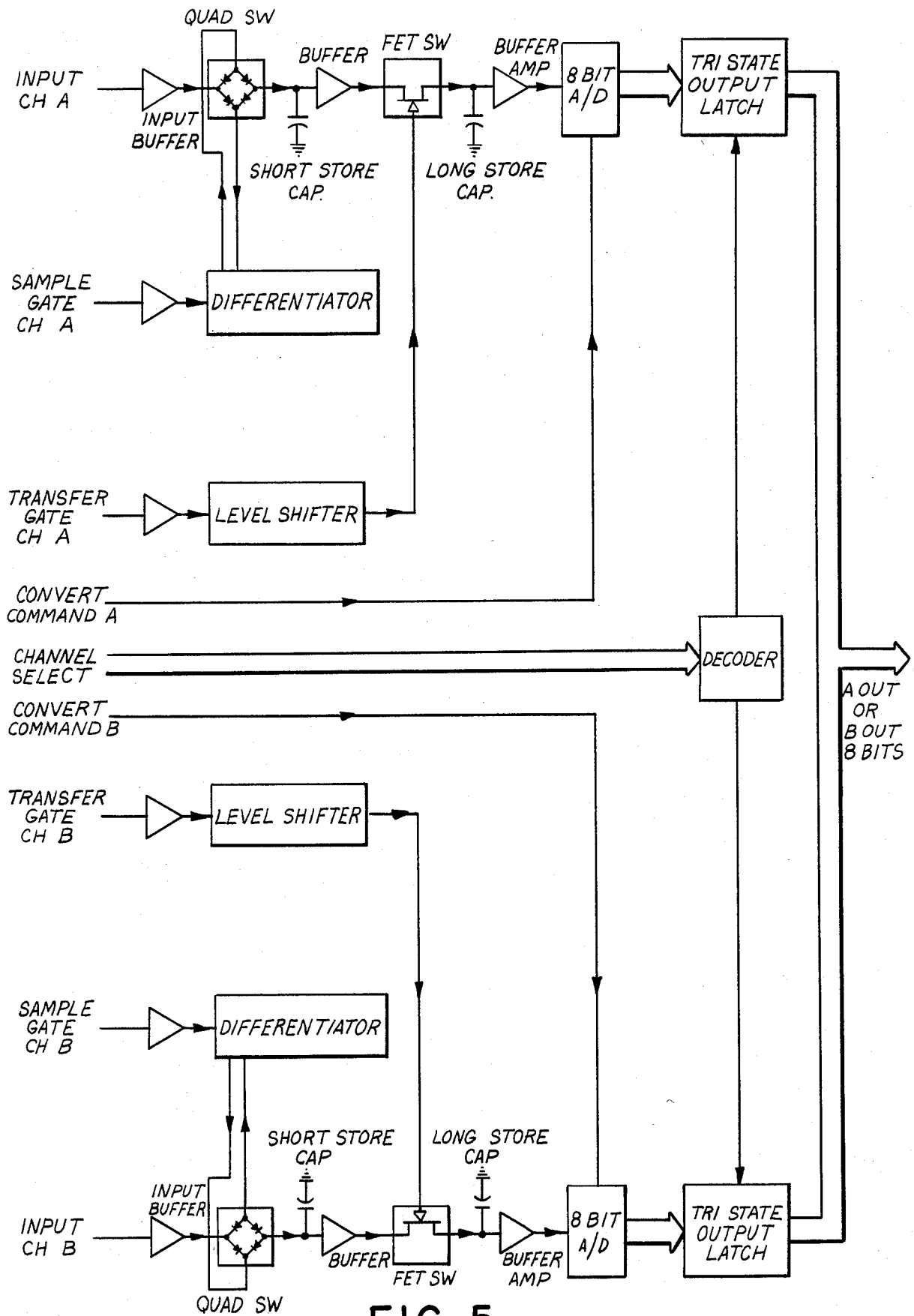
FIG. 5 is a block diagram of the sampling subsystem.

A block diagram of the sampling and memory subsystem is illustrated in FIG. 5. As shown therein, it includes high speed sample-and-hold circuitry which samples the applied input signal within a narrow window, and holds the sampled voltage long enough for it to be converted to digital form by an eight bit analog-to-digital converter. It also includes high speed logic circuitry for storing the digital equivalent (eight bits) of the sampled input waveform. The sampling circuitry includes a quad diode bridge, capacitors, buffers, an electronic switch, an analog-to-digital converter, counters, control logic and memory elements (not shown in FIG. 5 but they are illustrated as the sampler memory in FIG. 1). The trigger signals Sample Gate Ch A, Transfer Gate Ch A, Convert Command A, Convert Command B, Transfer Gate B, and Sample Gate Ch B are all generated by the trigger generator of FIG. 3 that depicts a trigger which is the origin of the trigger signals.

As configured, the sampler is a two channel device which has two separate signal input channels and one common digital output. Either channel can be multiplexed on to a common set of output converter pins. Each channel consists of an input buffer providing high input impedance, followed by a quad switch, a short term storage capacitor, and another buffer to isolate the short term capacitor. Next is a FET switch and a long term storage capacitor. Following the long term storage capacitor is another buffer amplifier which provides isolation for the long term capacitor and also provides gain to calibrate the full scale output of the system. The output of the buffer amplifier is fed to an 8 bit bipolar D/A converter. The 8 line digital output signal from the D/A converter is routed to a latching output port.

The output ports of both channels share a common set of output lines. The only common circuit element shared by both channels is a decoder chip which causes the selected channel to read-out. When the channels are not emitting data they are in an "OFF" state, i.e., they appear as an open circuit.

The differentiator circuit is activated by the leading edge of the sample gate signal. It produces narrow pulse of current which is used to turn on the quad diode switch.

The quad diode switch connects the output of the input buffer to the short term storage capacitor. This connection is made only for the duration of the current pulse. This duration represents the sample time. When the quad switch returns to the "OFF" (nonconducting) state a voltage remains on the short term storage capacitor. This voltage is proportional to the amplitude of the input signal during the sample interval when the quad switch is "ON" (conducting).

When the FET switch is actuated by the transfer gate Ch A signal, the sample voltage is placed on the long term storage capacitor. When the FET switch opens, the charge voltage trapped on the long term storage capacitor is proportional to the original sampled voltage, and the buffer amplifier output is a DC voltage representing the sampled value. Upon receipt of a "convert command" control signal, the 8 bit D/A converter provides an 8 bit digital output which is proportional to the original sampled voltage. The digital output signal represents both magnitude and sign of the sampled voltage.

Upon completion of the D-to-A conversion the digital output is latched into the output port. Unless a port (either A or B) has been selected the port output lines are maintained in an open circuit state.

The decoder circuit, common to both channels, is used to select the channel to be read out. The decoder circuit is under control of the channel select input lines.

Figure 6:
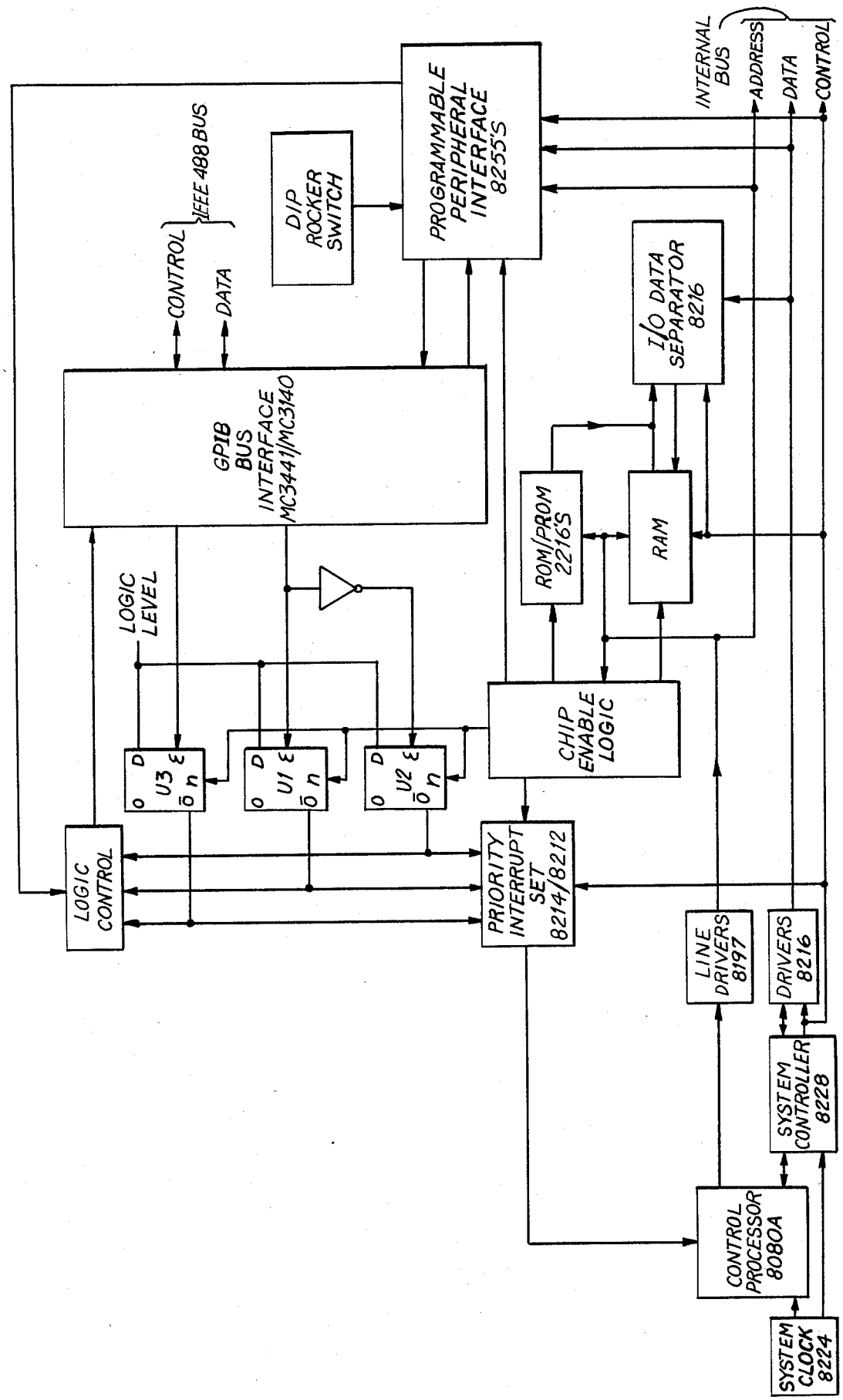
FIG. 6 is a block diagram of the microprocessor and interface subsystem.

A block diagram of the microprocessor and interface subsystem is illustrated in FIG. 6. As shown therein, it includes circuitry for providing the function commands, equation solutions, and data reductions, as well as the interface between the host system (not shown) and the various analyzer subsystems. The circuitry includes RAM, ROM, an 8080A microprocessor, I/O ports and control logic.

The microprocessor control subsystem receives commands and data over an IEEE-488 digital interface bus. ASCII character string data is received and checked with illegal, or bad, data. Valid data is processed and, at the appropriate time, the interpreted data for the requested output is loaded into the specified channels. The signal and sync outputs are generated in accordance with data stored and/or entered in 20, 8 bit (1 byte) data ports.

Referring now to FIG. 6 the circuitry shown therein can be divided into the following four networks: CPU set; system bus drivers; IEEE-488 interface; and memory circuits.

The CPU set consists of the Intel 8080A Control Processor, the Intel 8228 System Controller and the Intel 8224 System Clock. The CPU set performs all system processing functions and provides a stable timing reference for the system circuits. All address and control signals necessary to access the memory and all I/O ports in the system are initiated by the CPU set. All 78 instructions of the 8080A instruction set can be fetched and executed by the CPU set. The CPU set can respond to interrupt requests originating within or without the micro-processor control subsystem. In addition, it responds to wait requests from memory and/or I/O ports, which have an access time slower than the 8080A's cycle time. The CPU contains six 8-bit general purpose registers, an accumulator, a sixteen-bit program counter, a sixteen-bit stack pointer, a sixteen-line address bus and an eight-line bidirectional data bus. The six general purpose registers may be addressed individually or in pairs to provide both single and double precision operators. The sixteen-bit stack pointer may be used to address a last-in/first-out data storage area, located in any part of memory for the temporary storage of the program counter, status flags, accumulator, and any or all general purpose register to provide almost unlimited testing of subroutines. The entire instruction set of the 8080A is available for the generation of the programmable signal anzlyzer control programs. The accumulator group instructions include arithmetic and logical operations with direct, register indirect, and immediate address-modes. Move, load, and store instructions allow the movement of data, 8 or 16 bits between memory, the accumulator and/or any of the general purpose registers, using any of the available addressing modes. Jumps, conditional jumps, and computed jumps, allow branching to various parts of the program. Conditional and unconditional calls and returns from subroutines are included as are single-byte call instructions (Restarts) for interrupt operations. The accumulator, memory, or each of the six general purpose registers may be incremented or decremented. Extended incrementing or decrementing is available for adjusting register pairs and the stack pointer. Arithmetic and interrupt handling capability of the 8080A is extended by the inclusion of double precision operators such as stack manipulation and double add instructions. The 8080A CPU is a dynamic MOS, CPU requiring clock pulses at all times. It operates continually, fetching, decoding and executing instructions at a rate determined by the Intel 8224 System clock generator. The clock provides stable crystal controlled two-phased timing inputs for the 8080A. It also provides two outputs at a TTL level to be used for generating synchronized reset and ready signals for the CPU. 'Ready' and 'Reset' inputs, which are essentially asynchronous inputs, are synchronized to system timing within the 8224 chip to provide the required inputs to the CPU. All processing activities of the CPU set are referred to the period of the two clock signals. The 8228 System Controller generates all signals required to interface directly the 8080A with system RAM, ROM, and I/O ports. It isolates the 8080A data bus from the system bus. The 8228 generates the correct control signals to allow the use of multiple byte instructions in response to an Interrupt Acknowledge by the 8080A.

Tri-state, high power System Bus Drivers are provided on all address, data and control outputs of the CPU set.

The IEEE-488 Bus Interface (GPIB) circuitry consists of two Intel 8255 Programmable Peripheral Interface microcircuits, the Motorola MC3441 and the Motorola MC3440 GPIB bus interface microcircuit, Priority Interrupt Chip Set (Intel 8214 and Intel 8212) and other conventional flip-flops, gates and decoders. The GPIB circuitry provides all the initial high speed handshake signals required on the GPIB. It provides the proper input impedance and necessary drive capability to operate in a GPIB system. The high speed response to command data, IFC interrupts, is provided by Command flip-flop U1, Data flip-flop U2 and IFC flip-flop U3. These flip-flops initially set the GPIB bus interface drivers and receivers to their proper state in response to the attention and IFC signals on the GPIB. They simultaneously generate a proper interrupt to the 8080A through the Priority Interrupt Chip Set. The flip-flops will hold the GPIB in the suspended state initially required, until the slower firmware routine is actuated to take over handshake operations on the GPIB. When the firmware takes over, the flip-flops will be reset enabling them to respond to the next interrupt. One register of the input 8255 is used to sense the switch positions of five DIP rocker switches. These are compared to the incoming address on the GPIB to determine if further response is necessary. The five switches are set up at the time of installation into the system.

The memory circuits of the microprocessor control subsystem consist of 10K of ROM/PROM and 4K of RAM. The Random Access Memory (RAM) section provides the user with 4096×8 bits of storage area. This is normally used for storage of variable information used during execution of its instructions. It may also be used for temporary storage of a self-test procedure used during test of the subsystem. The Read Only Memory (ROM/PROM) section consists of five Intel 2216 2048×8 bit EPROMS (Erasable Programmable Read-Only-Memory). The first chip (2048×8) has the IEEE Bus Manager program inserted. There is also a monitor program which allows user interaction with the Microprocessor Control subsystem through the host computer when testing and trouble-shooting. The memory circuits contain the Programmable Signal Analyzer system which enables the subsystem to perform functions.

Figure 7:
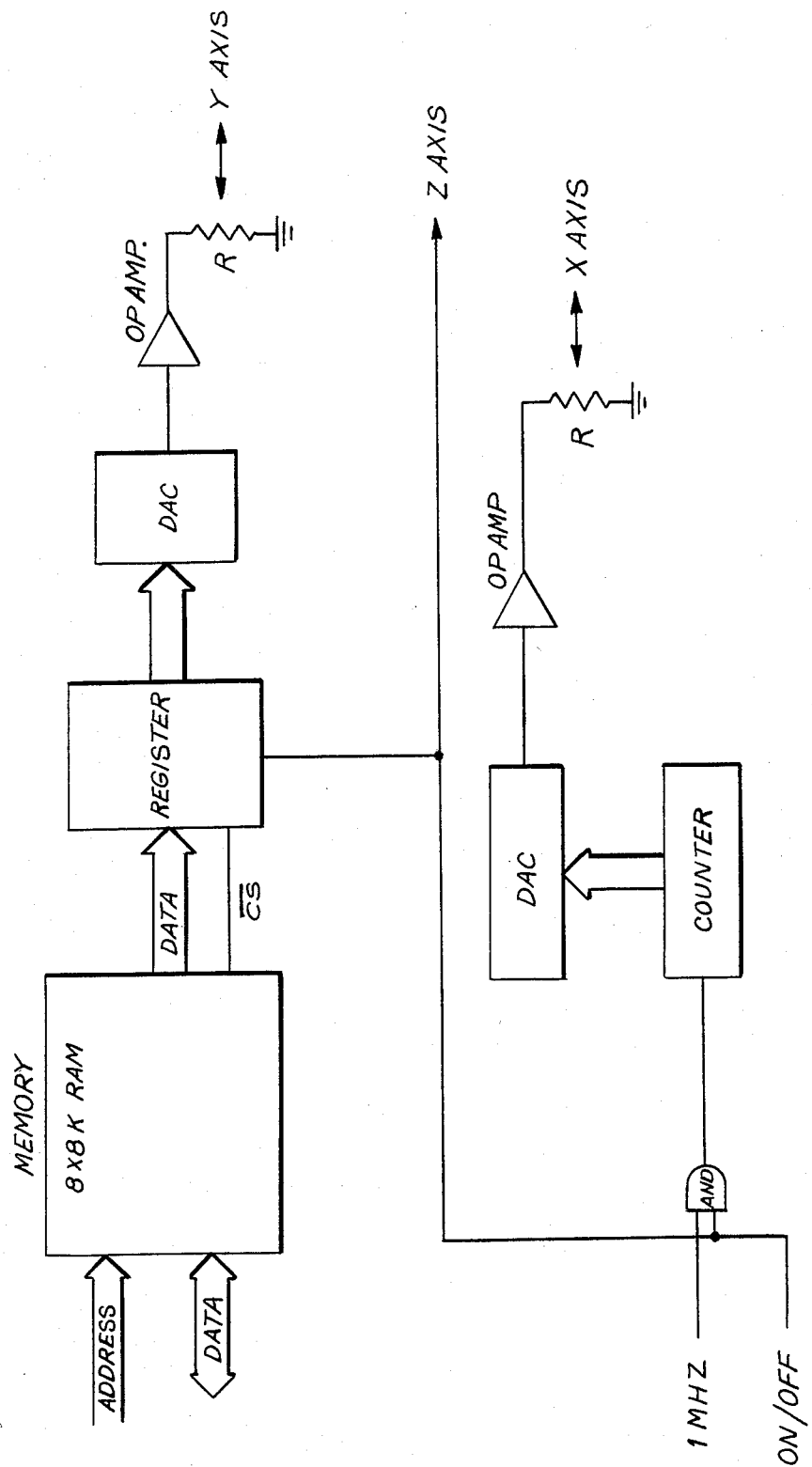
FIG. 7 is a block diagram of the display subsystem.

A block diagram of the display subsystem is illustrated in FIG. 7. As shown therein, it contains the circuitry for selectively displaying the sampled analog input waveform or the calculated values of the analog signal. The circuitry includes counters, registers, digital to analog converters (DAC), operational amplifiers and random access memory and combinational logic.

The function of the RAM and display subsystem is to provide the memory expansion for the microprocessor and provide the sweep circuitry necessary for generating a visual display (X-Y).

The memory expansion contains 8×8K of Random Access Memory (RAM) and is used to supplement the microprocessor memory as a scratch pad and sample storage of sampled data.

The X axis sweep generator contains a 12 bit counter, D to A converter, operational amplifier and control logic. The X axis counter free runs at a 1 MHZ rate. The count is converted by the DAC to analog form and amplified by the operational amplifier.

The Y axis is generated by reading a specific memory location, storing it and then converting it to analog form by a second DAC and operational amplifier.

Both the X and Y sweeps are synchronized by a command just prior to writing in the display. A Z axis control is provided to control the display intensity.

The maximum number of samples displayed is 1024. If less samples had been taken, the display sweep length is automatically changed (under microprocessor control) to reflect the actual number taken.

The above description of the preferred embodiment is exemplary and should not be considered as limiting the scope of the present invention which is defined by the following claims.

What is claimed is:

1. A remotely programmable multi-channel signal analyzer for automatically evaluating and displaying selected parameters of analog input signals comprising:
   a. a plurality of signal channels wherein each of said plurality of signal channels is configured to process automatically one analog input signal and includes;
      1. autoranging means for normalizing the amplitude of the analog input signal within a window having predetermined positive and negative values;
      2. delay means operatively connected to said autoranging means for generating sampling signals to selectively sample the normalized analog signal; and
      3. digital conversion means connected to said delay means and including non-real time sampling mean for converting the normalized analog signal into digital data;
   b. means for storing the digital data resulting from the digital conversion of each of the normalized analog signals;
   c. reference timing means for generating a timing base for the analyzer;
   d. microprocessor means responsive to said reference timing means for controlling automatically the operation of said plurality of signal channels and said storing means, said microprocessor means running a program for manipulating the stored digital data such that values of selected parameters for each of the analog input signals are caluculated, said microprocessor means further including interface means for effecting communication between the analyzer and an external controller thereby providing the analyzer with a remote programming capability; and e. display means connected to said storing means for displaying the calculated values of the selected parameters for each of the analog input signals.

2. A remotely programmable multi-channel signal analyzer as recited in claim 1 wherein each of said plurality of delay means is responsive to an external trigger.

3. A remotely programmable multi-channel signal analyzer as recited in claim 1 wherein said reference timing means is responsive to an external signal source.

4. A remotely programmable multi-channel signal analyzer as recited in claim 1 wherein communication between said interface means and said external controller is via an IEEE-488 compatible interface bus.

5. A remotely programmable multi-channel signal analyzer as recited in claim 6 wherein said autoranging means includes a comparator for comparing the analog input signal to reference signals corresponding to said predetermined positive and negative values, and relay controlled resitance means responsive to the output of said comparator.

6. A remotely programmable multi-channel signal analyzer as recited in claim 5 wherein said predetermined positive and negative values are +1 and −1 volt.

7. A remotely programmable multi-channel signal analyzer as recited in claim 6 wherein said window is stepped in 10 millivolt increments and compared to determine the most positive and negative portions of the analog input signal.

8. A remotely programmable multi-channel signal analyzer according to claim 7 wherein the 10%, 50% and 90% levels of the analog input signal are determined.

* * * * *

UNITED STATES PATENT AND TRADEMARK OFFICE
CERTIFICATE OF CORRECTION

PATENT NO.   : 4,507,740
DATED        : March 26, 1985
INVENTOR(S)  : ALBERT A. STAR ET AL It is certified that error appears in the above-identified patent and that said Letters Patent is hereby corrected as shown below:

Col. 1, line 22, ",," should be -- , --
Col. 1, line 27, a period should be provided after "process"
Col. 1, line 63, "ot" should be -- of --
Col. 2, line 11, "delays" should be -- delay --
Col. 2, line 29, the colon should be a semicolon
Col. 2, line 31, the colon should be a semicolon
Col. 3, line 5, a comma should be provided before "and"
Col. 5, line 14, "Gate B" should be -- Gate Ch B --

Col. 9, line 18, which is claim 5, "6" should be -- 1 --

Signed and Sealed this

Eleventh Day of August, 1987

Attest:

DONALD J. QUIGG

Attesting Officer

Commissioner of Patents and Trademarks